(12) United States Patent
Kwon et al.

(10) Patent No.: US 9,082,791 B2
(45) Date of Patent: Jul. 14, 2015

(54) METHOD OF FORMING LOW-RESISTANCE WIRE AND METHOD OF MANUFACTURING THIN FILM TRANSISTOR USING THE SAME

(71) Applicant: LG DISPLAY CO., LTD., Seoul (KR)

(72) Inventors: Ohnam Kwon, Paju-si (KR); Haeyeol Kim, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 90 days.

(21) Appl. No.: 13/728,709

(22) Filed: Dec. 27, 2012

(65) Prior Publication Data

US 2014/0073094 A1  Mar. 13, 2014

(30) Foreign Application Priority Data

Sep. 11, 2012 (KR) .......................... 10-2012-0100259

(51) Int. Cl.
| | | |
|---|---|---|
| H01L 21/44 | (2006.01) | |
| H01L 29/66 | (2006.01) | |
| H01L 21/768 | (2006.01) | |
| H01L 21/311 | (2006.01) | |
| H01L 29/423 | (2006.01) | |
| H01L 29/45 | (2006.01) | |
| H01L 29/49 | (2006.01) | |
| H01L 29/786 | (2006.01) | |
| H01L 29/40 | (2006.01) | |

(52) U.S. Cl.
CPC .... *H01L 29/66742* (2013.01); *H01L 21/31127* (2013.01); *H01L 21/31144* (2013.01); *H01L 21/7688* (2013.01); *H01L 21/76877* (2013.01); *H01L 29/401* (2013.01); *H01L 29/42384* (2013.01); *H01L 29/458* (2013.01); *H01L 29/4908* (2013.01); *H01L 29/66765* (2013.01); *H01L 29/78603* (2013.01)

(58) Field of Classification Search
CPC ................ H01L 29/4908; H01L 29/40; H01L 29/66007; H01L 21/311; H01L 21/31127; H01L 21/31144; H01L 21/7688; H01L 21/7687; H05K 3/143
USPC ................. 438/149, 151, 153–154, 197, 199, 438/669–670
See application file for complete search history.

(56) References Cited

U.S. PATENT DOCUMENTS

| | | | |
|---|---|---|---|
| 2009/0117333 A1* | 5/2009 | Lee et al. ........................ | 428/156 |
| 2009/0236627 A1* | 9/2009 | Kim et al. ........................ | 257/99 |
| 2011/0300702 A1 | 12/2011 | Isono | |

OTHER PUBLICATIONS

Examination Report dated Apr. 14, 2015 for European Application No. 12 198 655.8, 5 pages.

* cited by examiner

*Primary Examiner* — Thanhha Pham
(74) *Attorney, Agent, or Firm* — Brinks Gilson & Lione

(57) ABSTRACT

This document relates to a method of forming low-resistance metal gate and data wirings and a method of manufacturing a thin film transistor using the same. The method of the wiring includes depositing a metal layer on a base layer; exposing a portion of the base layer by removing a portion of the metal layer; forming grooves in the base layer; forming a seed layer in the grooves of the base layer; and forming a wire consisting of the seed layer and a plated layer by plating a plating material on the seed layer formed in the grooves of the base layer.

6 Claims, 20 Drawing Sheets

REALATED ART

REALATED ART

REALATED ART

REALATED ART

REALATED ART

REALATED ART

FIG. 5B
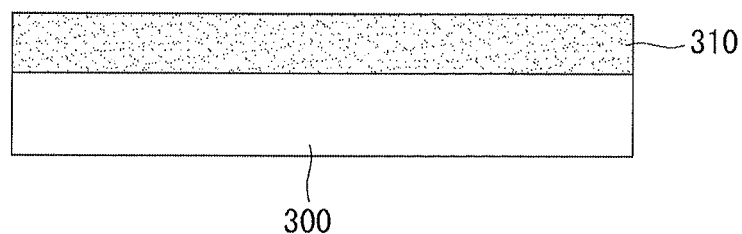
FIG. 5C
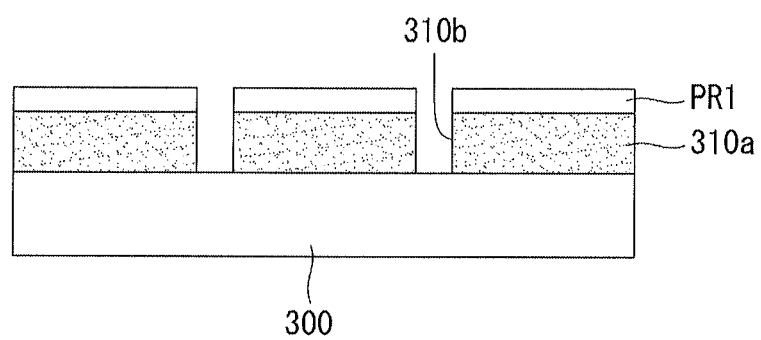
FIG. 5D

METHOD OF FORMING LOW-RESISTANCE WIRE AND METHOD OF MANUFACTURING THIN FILM TRANSISTOR USING THE SAME

This application claims priority under 356 U.S.C. §119(a) to Korean Patent Application No. 10-2012-0100259 filed on Sep. 11, 2012, which is incorporated by reference in its entirety.

BACKGROUND

1. Field

This document relates to method of forming a low-resistance wire and a method of manufacturing a thin film transistor using the same, and more particularly, to a method of forming low-resistance metal gate and data wirings and a method of manufacturing a thin film transistor using the same.

2. Discussion of the Related Art

Various flat panel displays having reduced weight and volume when compared with a cathode ray tube have been developed. Flat panel displays (FPDs) include liquid crystal displays (LCD), field emission displays (FED), plasma display panels (PDP), organic light emitting diode (OLED) displays, and the like.

Out of the flat panel displays, the application range of the liquid crystal displays has widened because the liquid crystal display can be manufactured to be lightweight and thin and can be driven under low power consumption. Moreover, the OLED displays have a fast response time equal to or less than about 1 ms, low power consumption, and a wide viewing angle by a self light emitting. Thus, the OLED displays have been considered as a next generation display.

The liquid crystal displays and the OLED displays are driven by a passive matrix method or an active matrix method using a thin film transistor. The active matrix method, in which a thin film transistor and a pixel electrode connected to the thin film transistor are arranged in a matrix, are attracting considerable attention due to its high resolution and superior moving picture reproducing capability.

An active matrix display using a thin film transistor supplies signals to each pixel through gate wirings for supplying scan signals and data wirings for supplying data signals, and supplies power to each pixel through power lines for supplying power.

For a large-sized display device of more than 18 inches having a high resolution, the material used for the gate and data wirings becomes a highly important factor for determining picture quality because the picture quality depends on the specific resistance of the material. The resistance of the entire lines including the gate wirings and the data wirings increases with the trend of large-sized and high-resolution displays. This increases the resistance of each line and the parasitic capacitance between the lines, thus leading to an RC delay caused by resistance-capacitance. Moreover, crosstalk occurs due to the RC-delay, thereby deteriorating picture quality.

Therefore, low-resistance metals such as aluminum or aluminum alloys may be used for the gate wirings and the data wirings in order to prevent such an RC-delay. However, aluminum has poor chemical corrosion resistance, and may cause a defect in a subsequent process.

To solve this problem, the line width or the line thickness may be increased to reduce resistance. However, increasing the line thickness may increase the risk of short-circuiting due to a large step coverage.

Hereinafter, the above-described problem will be explained in more detail with reference to FIGS. 1a to 1e.

FIGS. 1A to 1E are cross-sectional views showing a method of manufacturing a thin film transistor used for a related art active matrix display.

Referring to FIG. 1A, a gate metal film is deposited on a substrate 10 and patterned to form a gate wiring (not shown) and a gate electrode 20 extending from the gate wiring.

Referring to FIG. 1B, a gate insulating film 30, an amorphous silicon film 32, and an impurity-containing amorphous silicon film 34 are sequentially deposited over the entire surface of the substrate 10 with the gate electrode 20 formed thereon so as to cover the gate electrode 20. The amorphous silicon film 32 and the impurity-containing amorphous silicon film 34 are patterned to form an active layer 35.

Referring to FIG. 1C, a data metal layer is deposited over the entire surface of the substrate 10 with the active layer 35 formed thereon. The data metal layer is patterned to form a data wiring (not shown) crossing the gate wiring, with the gate insulating film 30 interposed therebetween, and a source electrode 42 and a drain electrode 44 on the active layer 35 so as to partially overlap with the gate electrode 20 and face each other. Next, an impurity-containing amorphous silicon pattern exposed between the source electrode 42 and the drain electrode 44 is etched using the source electrode 42 and the drain electrode 44 as a mask, thereby forming a channel Ch.

Referring to FIG. 1D, a passivation film 50 is formed over the entire surface of the substrate 10 with the data wiring (not shown), the source electrode 42, and the drain electrode 44 formed thereon, and then a contact hole 52 is formed to expose a portion of the drain electrode 44 of the thin film transistor. The passivation film 50 is for protecting the channel Ch from external moisture or contact.

Referring to FIG. 1E, a transparent metal layer is deposited on the passivation film 50 with the contact hole formed therein, and then patterned to form a pixel electrode 60. The pixel electrode 60 is connected to the drain electrode 44 of the thin film transistor exposed through the contact hole 52 of the passivation film 50.

FIG. 2 is an enlarged cross-sectional view showing portion A of FIG. 1e. Referring to FIG. 2, the gate electrode 20, the source electrode 42, and the drain electrode 44 are protruded higher than their neighboring parts because they are formed by patterning. Accordingly, when the source electrode 42 and the pixel electrode 60 are formed thick to decrease electrical resistance, short-circuiting may occur because the step coverage of the gate insulating film 30, active layer 35, source electrode 42, and drain electrode 44 to be formed during a subsequent process increases because of the step difference with the gate electrode. Also, when the source electrode 42 and the drain electrode 44 are likewise formed thick to decrease electrical resistance, short-circuiting may occur because the step coverage of the passivation film 50 and the pixel electrode 60 to be formed during a subsequent process increases because of the step difference with the source electrode and the drain electrode.

Moreover, as shown in FIG. 2, the parasitic capacitance Cp between the gate electrode 20 and the source and drain electrodes 42 and 44 may increase due to the step difference with the gate electrode 20. This may cause severe flickering on the display device and generate a picture quality defect.

SUMMARY

A method of forming a wire, the method comprises: depositing a metal layer on a base layer; exposing a portion of the base layer by removing a portion of the metal layer; forming grooves in the base layer by removing the exposed portion of the base layer by using the metal layer as a mask; forming a seed layer in the grooves of the base layer; and forming a wire consisting of the seed layer and a plated layer by plating a plating material on the seed layer formed in the grooves of the base layer by an electroless plating method or electroplating method.

According to another embodiment, there is provided a method of forming a wire, the method comprising: depositing an organic insulating film on a base layer; forming grooves or openings in the organic insulating film by removing a portion of the organic insulating film; forming a seed layer in the grooves or openings of the organic insulating film; and forming a wire consisting of the seed layer and a plated layer by plating a plating material on the seed layer formed in the grooves of the organic insulating layer by an electroless plating method or electroplating method.

According to a further another embodiment, there is provided a method of forming a wire, the method comprising: sequentially applying an organic insulating film and a metal layer on a base layer; exposing a portion of the organic insulating film by removing a portion of the metal layer; forming grooves in the organic insulating film by removing the exposed portion of the organic insulating film by using the metal layer as a mask; forming a seed layer in the grooves of the organic insulating film; and forming a wire consisting of the seed layer and a plated layer by plating a plating material on the seed layer formed in the grooves of the organic insulating film by an electroless plating method or electroplating method.

According to an another embodiment, there is provided a method of manufacturing a thin film transistor, the method comprising: forming a wire consisting of a seed layer and a plated layer as a gate electrode by using the method claimed in claim 1; sequentially depositing a gate insulating film, an amorphous silicon film, and an impurity-containing amorphous silicon film so as to cover the gate electrode, and patterning the amorphous silicon film and the impurity-containing amorphous silicon film to form a semiconductor layer; depositing a data metal layer over the entire surface of the substrate with the semiconductor layer formed thereon, and patterning the data metal layer to form a source electrode and a drain electrode on the semiconductor layer so as to face each other; and forming a channel by removing the impurity-containing amorphous silicon film exposed between the source electrode and the drain electrode by using the source electrode and the drain electrode as a mask.

According to another embodiment, there is provided a method of manufacturing a thin film transistor, the method comprising: forming a wire consisting of a seed layer and a plated layer as a gate electrode by using the method claimed in claim 1; sequentially depositing a gate insulating film, an amorphous silicon film, and an impurity-containing amorphous silicon film so as to cover the gate electrode, and patterning the amorphous silicon film and the impurity-containing amorphous silicon film to form a semiconductor layer; forming an organic insulating film on the gate insulating film over the entire surface of the substrate with the semiconductor layer formed thereon by using the method claimed in claim 8 or 12, forming grooves or through holes in the organic insulating film, and forming a data conductive layer consisting of a seed layer and a plated layer in the grooves or through holes; patterning the data conductive layer to form a source electrode and a drain electrode on the semiconductor layer so as to face each other; and forming a channel by removing the impurity-containing amorphous silicon film exposed between the source electrode and the drain electrode by using the source electrode and the drain electrode as a mask.

According to a further another embodiment, there is provided a method of manufacturing a thin film transistor, the method comprising: forming a gate electrode on a base layer; sequentially depositing a gate insulating film, an amorphous silicon film, and an impurity-containing amorphous silicon film over the entire surface of the base layer with the gate electrode formed thereon so as to cover the gate electrode, and patterning the amorphous silicon film and the impurity-containing amorphous silicon film to form a semiconductor layer; forming an organic insulating film on the gate insulating film over the entire surface of the substrate with the semiconductor layer formed thereon by using the method claimed in claim 8 or 12, forming grooves or through holes in the organic insulating film, and forming a data conductive layer consisting of a seed layer and a plated layer in the grooves or through holes; patterning the data conductive layer to form a source electrode and a drain electrode on the semiconductor layer so as to face each other; and forming a channel by removing the impurity-containing amorphous silicon film exposed between the source electrode and the drain electrode by using the source electrode and the drain electrode as a mask.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 5A to 5F are cross-sectional views showing a process of forming a wire of a flat panel display according to a third exemplary embodiment of the present invention;

DETAILED DESCRIPTION

Figure 1A:
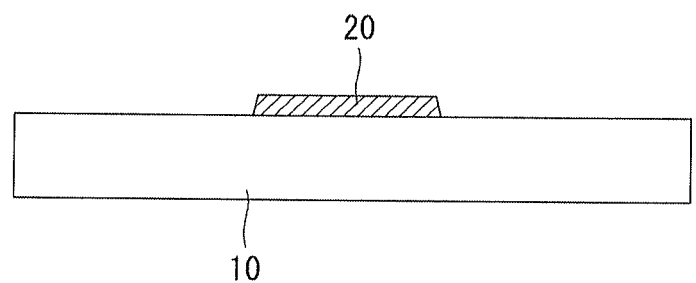
FIGS. 1A to 1E are cross-sectional views showing a method of manufacturing a thin film transistor used for a related art active matrix display.
Figure 1B:
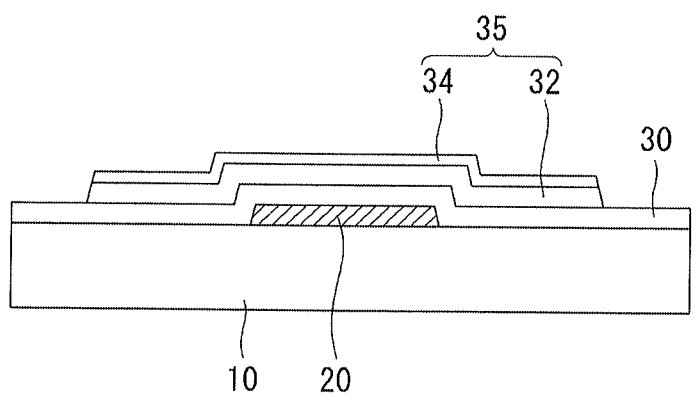
Figure 1C:
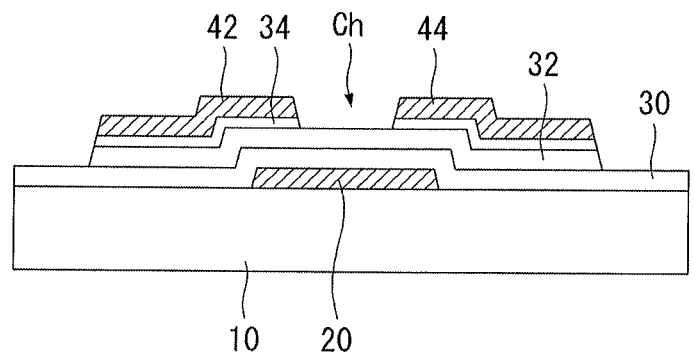
Figure 1D:
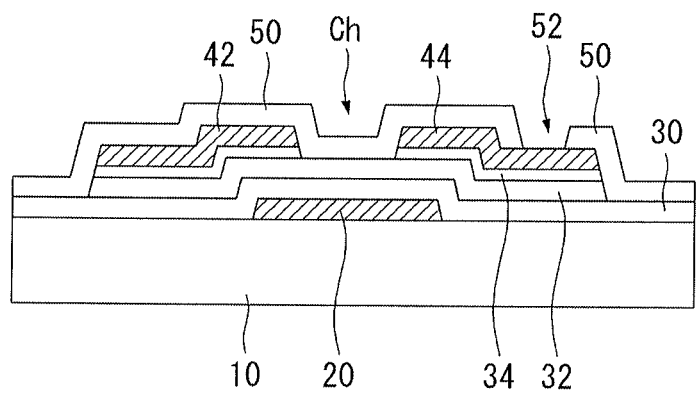
Figure 1E:
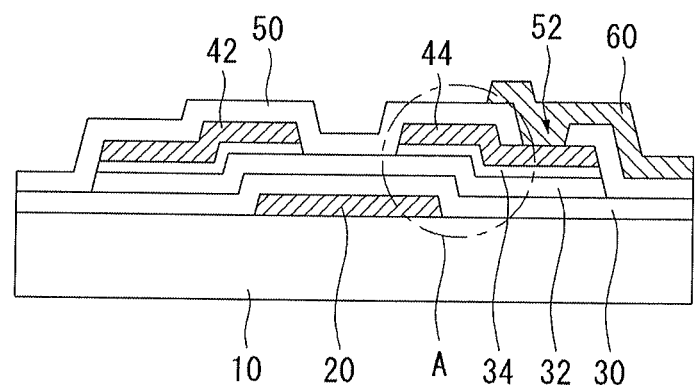
Figure 2:
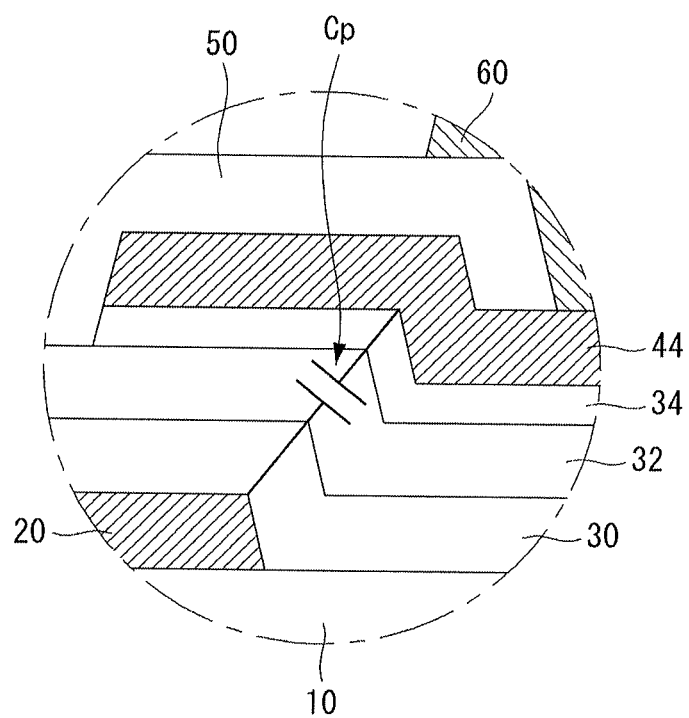
FIG. 2 is an enlarged cross-sectional view showing portion A of FIG. 1E.

Hereinafter, exemplary embodiments of the present invention will be described in detail with reference to the accompanying drawings. Like reference numerals designate substantially like elements throughout the specification.

First of all, a method of forming a wire of a flat panel display according to a first exemplary embodiment of the present invention will be described with reference to FIGS. 3A to 3F. The wire to be formed in the first exemplary embodiment includes a gate wiring having a gate electrode and a data wiring comprising a source electrode and a gate electrode.

Figure 3A:
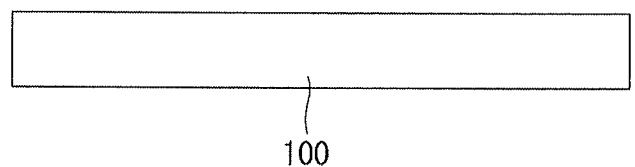
FIGS. 3A to 3F are cross-sectional views showing a process of forming a wire of a flat panel display according to a first exemplary embodiment of the present invention.
Figure 3B:
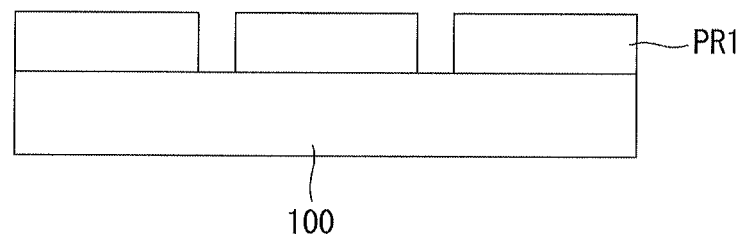

Referring to FIGS. 3A and 3B, a photoresist pattern PR1 is formed on a base layer 100 by a photolithography process so as to expose a portion of the base layer 100 under it. The base layer 100 is formed of a glass material, such as boro-phosphor silicate glass (BPSG), undoped silicate glass (USG), and phosphor silicate glass (PSG), or a plastic material when forming a gate wiring, or formed of an inorganic insulator film, such as a silicon oxide film and a silicon nitride when forming a data wiring.

Figure 3C:
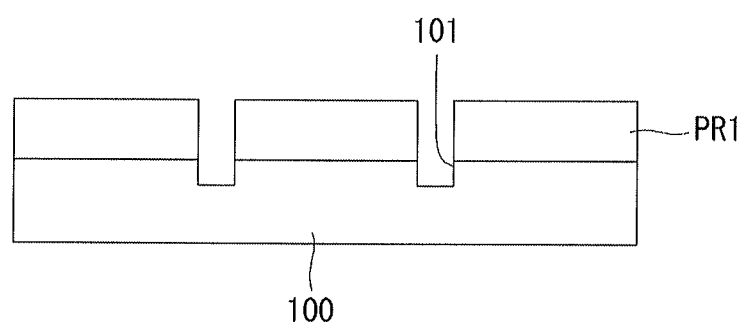

Referring to FIG. 3C, the base layer 100 exposed through the photoresist pattern PR1 is etched by dry etching using an etching gas to form grooves 101.

Figure 3D:
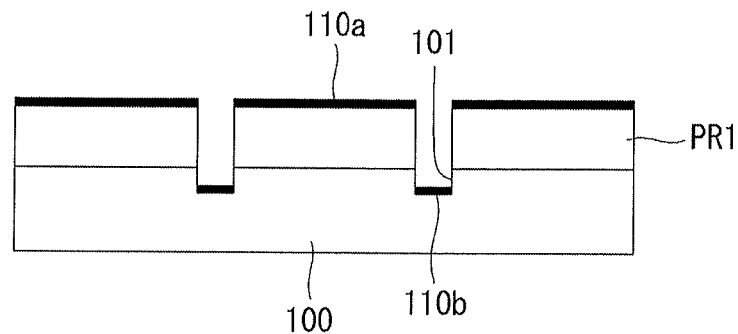

Referring to FIG. 3D, a metal such as Pd, Pt, Au, Cu, Mo, Cr, and Ti is applied onto the base layer 100 with the grooves 101 and the photoresist pattern PR1 by physical vapor deposition (PVD) or chemical vapor deposition (CVD) so that a first conductive layer 110a and 110b is formed on the photoresist pattern PR1 and in the grooves 101 of the base layer 100. The first conductive layer 110a and 110b may be formed of a single layer or double layers. If the first conductive layer 110a and 110b is formed of double layers, a metal having good contactability with the base layer 100 is formed as a lower layer.

Figure 3E:
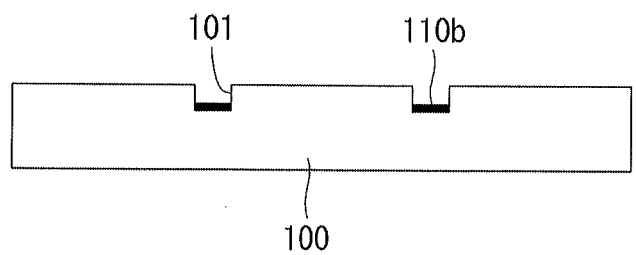

Referring to FIG. 3E, the photoresist pattern PR1 with the first conductive layer 110a is removed so that the first conductive layer 110b formed in the grooves 101 of the base layer 100 remains, thereby forming a seed metal 110b.

Figure 3F:
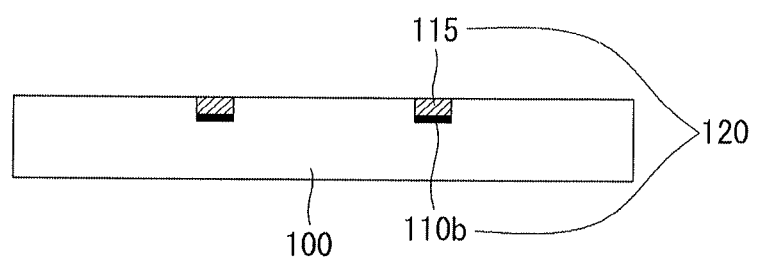

Referring to FIG. 3F, a plating metal 115, such as Ag, Au, and Cu, which are low-resistance metals, is plated on the seed metal 110b by a well-known electroplating method or electroless plating method, thereby forming a wire 120. The thickness of the wire 120 consisting of the seed metal 110b and the plating metal 115 is equal to or greater than the depth of the grooves 101 of the base layer 100, and may be properly selected as necessary.

Next, a method of forming a wire of a flat panel display according to a second exemplary embodiment of the present invention will be described with reference to FIGS. 4A to 4F. Like the wire to be formed in the first exemplary embodiment, the wire to be formed in the second exemplary embodiment includes a gate wiring having a gate electrode and a data wiring having a source electrode and a gate electrode. The wire forming method of the second exemplary embodiment is different from the wire forming method of the first exemplary embodiment in that a first conductive layer is additionally formed prior to forming a photoresist pattern.

Figure 4A:
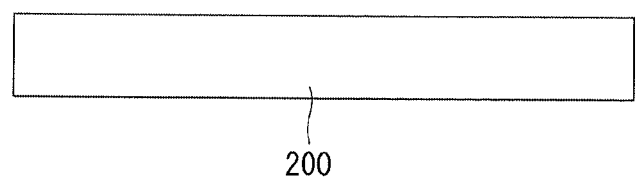
FIGS. 4A to 4G are cross-sectional views showing a process of forming a wire of a flat panel display according to a second exemplary embodiment of the present invention.
Figure 4B:
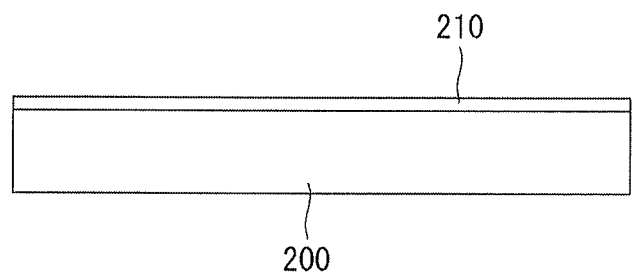

Referring to FIGS. 4A and 4B, a first conductive layer 210 made of Ti, an Ti-alloy, Al, and an Al-alloy is applied onto a base layer 200 by physical vapor deposition (PVD) or chemical vapor deposition (CVD). The base layer 200 is formed of a glass material, such as boro-phosphor silicate glass (BPSG), undoped silicate glass (USG), and phosphor silicate glass (PSG), or a plastic material when forming a gate wiring, or formed of an inorganic insulating film, such as a silicon oxide film and a silicon nitride when forming a data wiring.

Figure 4C:
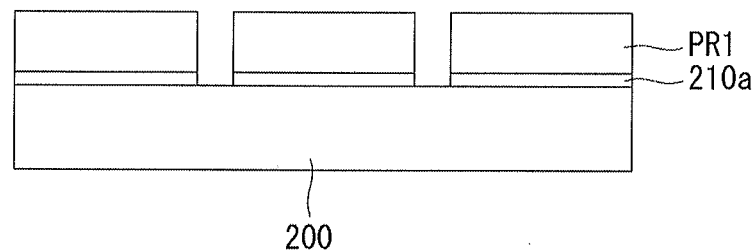

Referring to FIG. 4C, a photoresist pattern PR1 is formed on the base layer 200 with the first conductive layer 210 deposited thereon by a photolithography process so as to expose a portion of the first conductive layer 210. After that, the portion of the first conductive layer 210 exposed through the photoresist pattern PR1 is removed by wet etching using an etching solution, thereby forming a first conductive pattern 210a.

Figure 4D:
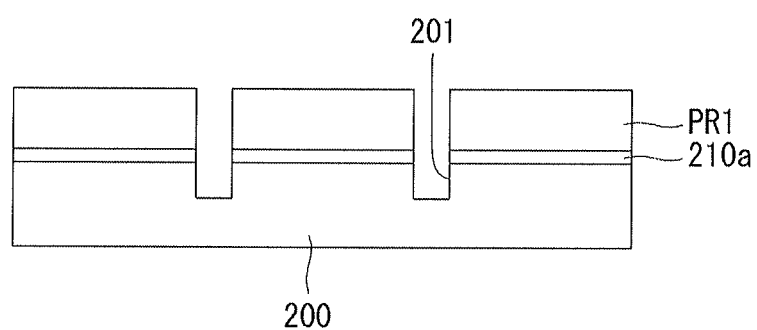

Referring to FIG. 4D, the photoresist pattern PR1 and the portion of the base layer 200 exposed through the first conductive pattern 210a are etched by dry etching using an etching as, thereby forming grooves 201 in the base layer 200.

Figure 4E:
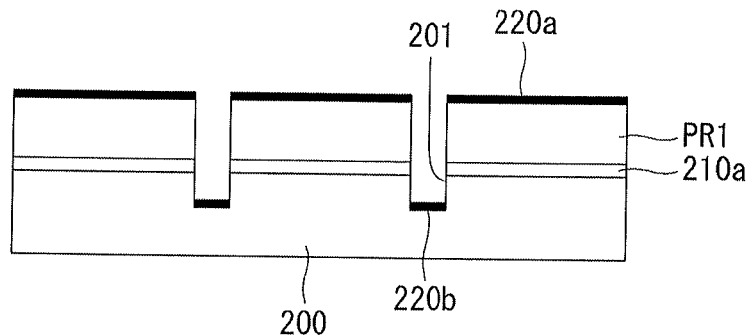

Referring to FIG. 4E, a metal such as Pd, Pt, Au, Cu, Mo, Cr, and Ti is applied onto the base layer 200 with the grooves 201 formed therein and the photoresist pattern PR1 by physical vapor deposition (PVD) or chemical vapor deposition (CVD) to form a second conductive layer 220a and 220b on the photoresist pattern PR1 and in the grooves 201 of the base layer 200.

Figure 4F:
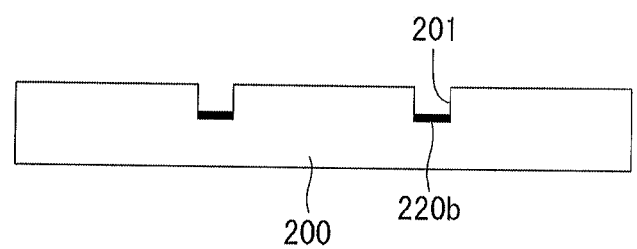

Referring to FIG. 4F, the photoresit pattern PR1 with the second conductive layer 220a is removed, and the second conductive layer 210a formed on the base layer 200 is selectively etched so that the second conductive layer 220b formed in the grooves 201 of the base layer 200 remains, thereby forming a seed metal 220b in the grooves 201 of the base layer 200.

Figure 4G:
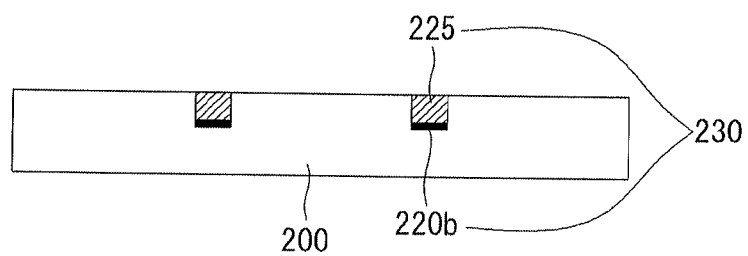

Referring to FIG. 4G, a plating metal 225, such as Ag, Au, and Cu, which are low-resistance metals, is plated on the seed metal 220b by a well-known electroplating method or electroless plating method, thereby forming a wire 230. The thickness of the wire 230 consisting of the seed metal 220b and the plating metal 225 is equal to or greater than the depth of the grooves 201 of the base layer 200, and may be properly selected as necessary.

According to the wire forming method of the second exemplary embodiment, the first conductive layer 210a is formed on the base layer 200, and this prevents the top surface of the base layer 200 from being excessively etched when forming the grooves 201 in the base layer 200. Therefore, the shape of the grooves 201 to be formed on the base layer 200 can be controlled more finely, compared to the wire forming method of the first exemplary embodiment.

Next, a method of forming a wire of a flat panel display according to a third exemplary embodiment of the present invention will be described with reference to FIGS. 5A to 5F. Like the wire to be formed in the first and second exemplary embodiments, the wire to be formed in the third exemplary embodiment comprises a gate wiring comprising a gate electrode and a data wiring comprising a source electrode and a gate electrode. The wire forming method of the third exemplary embodiment is different from the wire forming method of the first exemplary embodiment in that, after forming an organic insulating film with grooves (or through holes) on a baser layer, a wire is formed in the grooves of the organic insulating film.

Figure 5A:
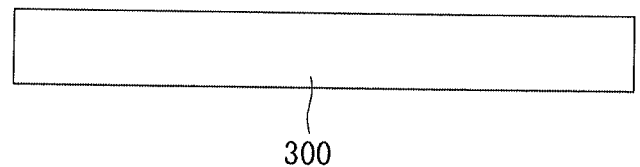

Referring to FIGS. 5A and 5B, an organic insulating film 310 made of polyimide, photo acryl, etc is formed on a base layer 300. The base layer 300 is formed of a glass material, such as boro-phosphor silicate glass (BPSG), undoped silicate glass (USG), and phosphor silicate glass (PSG), or a plastic material when forming a gate wiring, or formed of an inorganic insulating film, such as a silicon oxide film and a silicon nitride when forming a data wiring.

Referring to FIG. 5C, a photoresist pattern PR1 is formed on the base layer 300 with the organic insulating film 310 by a photolithography process so as to expose a portion of the organic insulating film 310. After that, the portion of the organic insulating film 310 exposed through the photoresist pattern Pr1 is removed by dry etching using an etching gas, thereby forming an organic insulating film pattern 310a having grooves or openings 310b.

Referring to FIG. 5D, a metal such as Pd, Pt, Au, Cu, Mo, Cr, and Ti is applied onto the photoresist pattern PR1 having the grooves or openings 310b by physical vapor deposition (PVD) or chemical vapor deposition (CVD) to form a first conductive layer 320a and 320b on the photoresist pattern PR1 and in the grooves 310b of the organic insulating film 310a.

Figure 5E:
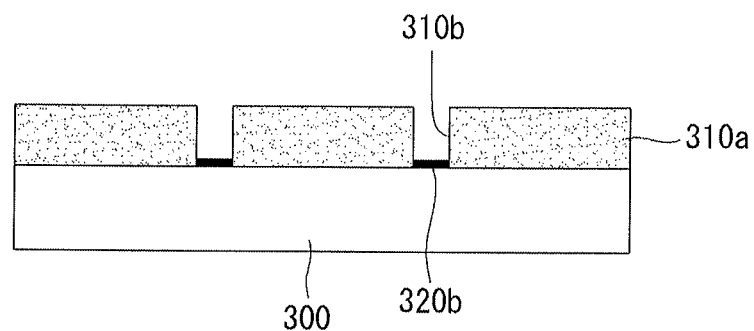

Referring to FIG. 5E, the photoresist pattern PR1 with the first conductive layer 320a is removed so that the first conductive layer 320b formed in the openings 310b of the organic insulating film pattern 310b remains, thereby forming a seed metal 320b.

Figure 5F:
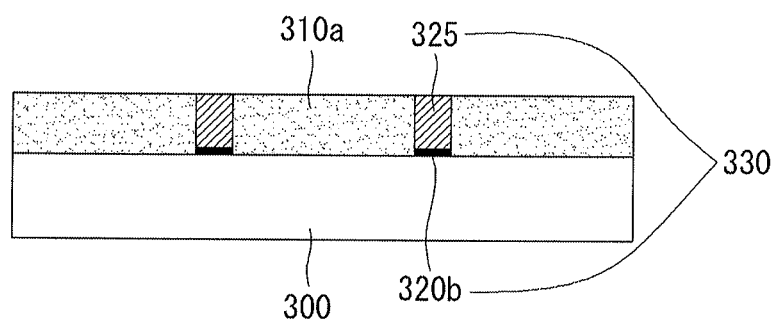

Referring to FIG. 5F, a plating metal 325, such as Ag, Au, and Cu, which are low-resistance metals, is plated on the seed metal 320b by a well-known electroplating method or electroless plating method, thereby forming a wire 330. The thickness of the wire 330 consisting of the seed metal 320b and the plating metal 325 is equal to or greater than the depth of the grooves or openings 310b of the organic insulating film pattern 310a, and may be properly selected as necessary.

According to the wire forming method of the third exemplary embodiment, a wire is formed in the grooves or openings of the organic insulating film, and this gives the effect of reducing the step difference with electrodes of the display device to be formed in a process subsequent to the formation of a source electrode and a drain electrode.

Next, a method of forming a wire of a flat panel display according to a fourth exemplary embodiment of the present invention will be described with reference to FIGS. 6A to 6I. Like the wire to be formed in the first to third exemplary embodiments, the wire to be formed in the fourth exemplary embodiment comprises a gate wiring comprising a gate electrode and a data wiring comprising a source electrode and a gate electrode. The wire forming method of the third exemplary embodiment is different from the wire forming method of the third exemplary embodiment in that a first conductive layer is formed after forming an organic insulating film on a base layer.

Figure 6A:
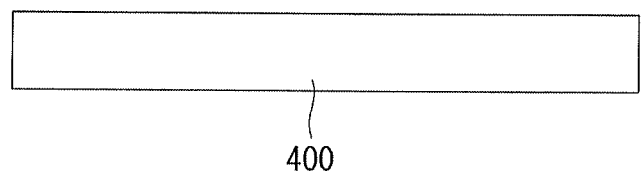
FIGS. 6A to 6I are cross-sectional views showing a process of forming a wire of a flat panel display according to a fourth exemplary embodiment of the present invention.
Figure 6B:
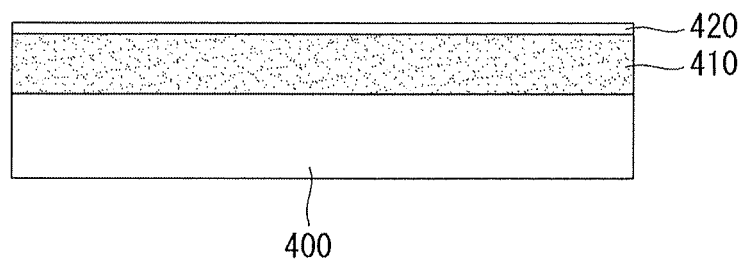

Referring to FIGS. 6A and 6B, an organic insulating film 410 made of polyimide, photo acryl, etc and a first conductive layer 420 are sequentially applied onto a base layer 400 by physical vapor deposition (PVD) or chemical vapor deposition (CVD). The base layer 400 is formed of a glass material, such as boro-phosphor silicate glass (BPSG), undoped silicate glass (USG), and phosphor silicate glass (PSG), or a plastic material when forming a gate wiring, or formed of an inorganic insulating film, such as a silicon oxide film and a silicon nitride when forming a data wiring. The first conductive layer 420 comprises Ti, a Ti-alloy, Al, and an Al-alloy.

Figure 6C:
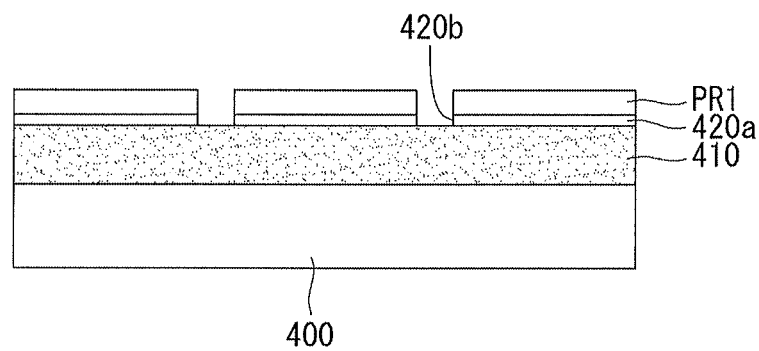

Referring to FIG. 6C, a first photoresist pattern PR1 is formed on the first conductive layer 420 by a photolithography process so as to expose a portion of the first conductive layer 420. After that, the portion of the first conductive layer 420 exposed through the first photoresist pattern PR1 is removed by wet etching using an etching solution, thereby forming a first conductive pattern 420a having openings 420b.

Figure 6D:
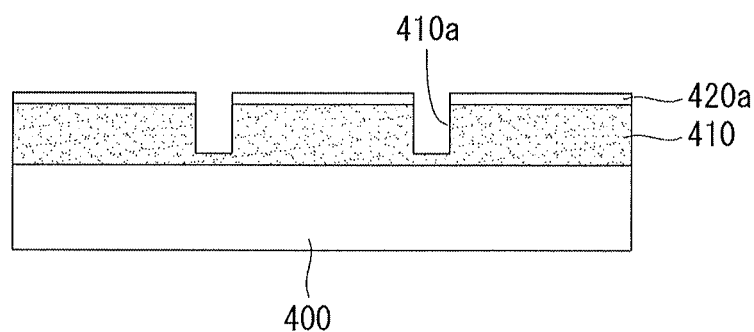

Referring to FIG. 6D, the first photoresist pattern PR1 is removed, and the organic insulating film 410 is dry-etched by using the first conductive pattern 420a as a mask, thereby forming grooves 410a in the organic insulating film 410.

Figure 6E:
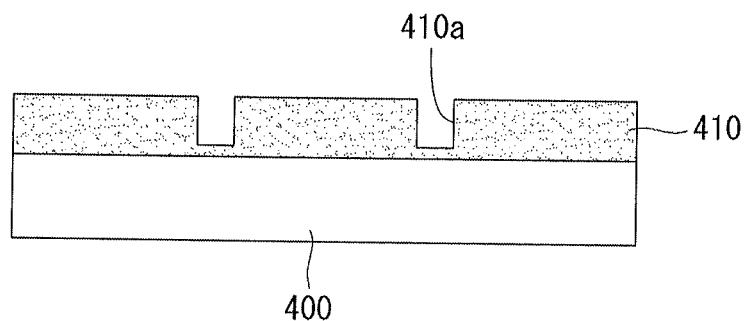

Referring to FIG. 6E, the first conductive pattern 420a formed on the organic insulating film 410 is selectively etched and removed to expose the organic insulating film 410.

Figure 6F:
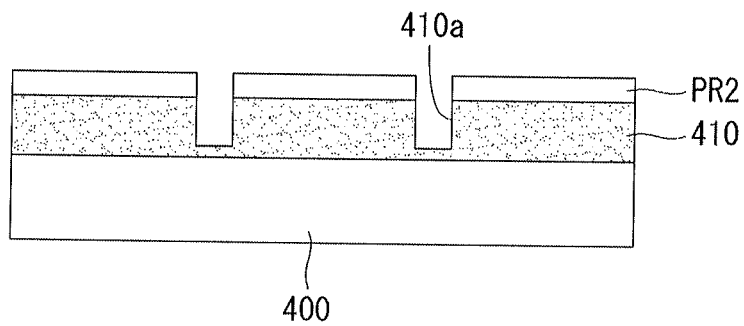

Referring to FIG. 6F, a second photoresist pattern PR2 having openings corresponding to the grooves 410a of the organic insulating film 410 is formed on the organic insulating film 410 with the grooves 410a by a photolithography process.

Figure 6G:
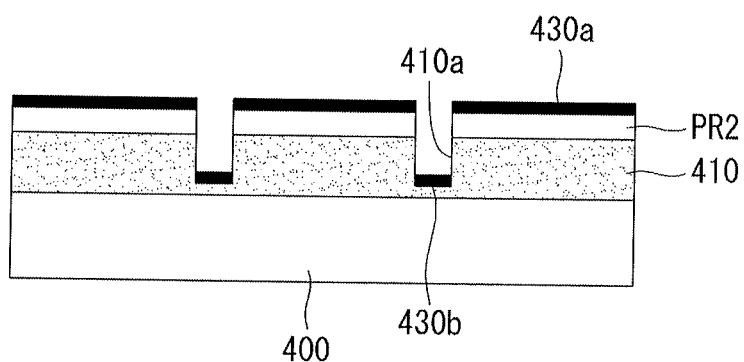

Referring to FIG. 6G, a metal such as Pd, Pt, Au, Cu, Mo, Cr, and Ti is applied onto the organic insulating film 410 with the grooves 410a formed therein and the second photoresist pattern PR2 by physical vapor deposition (PVD) or chemical vapor deposition (CVD) to form a second conductive layer 430a and 430b on the photoresist pattern PR1 and in the grooves 410b of the base layer 400.

Figure 6H:
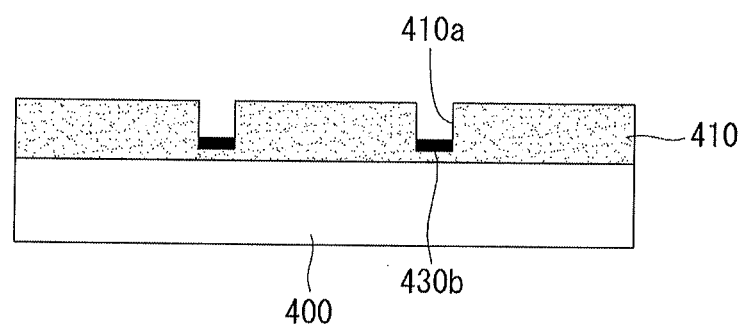

Referring to FIG. 6H, the second photoresist pattern PR2 with the second conductive layer 430a is removed so that the second conductive layer 430b formed in the openings 410b of the organic insulating film 410 remains, thereby forming a seed metal 430b.

Figure 6I:
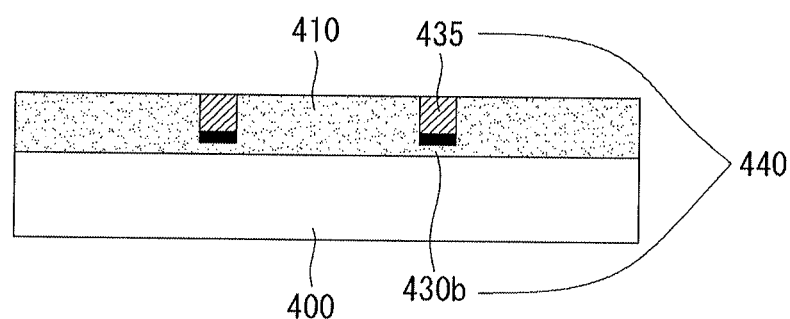

Referring to FIG. 6I, a plating metal 435, such as Ag, Au, and Cu, which are low-resistance metals, is plated on the seed metal 430b by a well-known electroplating method or electroless plating method, thereby forming a wire 440. The thickness of the wire 440 consisting of the seed metal 430b and the plating metal 435 is equal to or greater than the depth of the 410a of the organic insulating film 410, and may be properly selected as necessary.

According to the wire forming method of the fourth exemplary embodiment, the grooves 410a are formed in the organic insulating film 410 after the first conductive pattern 420a is formed on top of the organic insulating film 410, and this prevents the top surface of the organic insulating film 410 from being excessively etched when forming the grooves 410a in the organic insulating film 410. Therefore, the shape of the grooves 410a to be formed on the organic insulating film 410 can be controlled more finely, compared to the wire forming method of the third exemplary embodiment.

According to the above-described wire forming methods of the first to fourth exemplary embodiments, a wire can be formed in various combinations. That is, each of the wire forming methods of the first to fourth exemplary embodiments is applicable to a method of forming a gate wiring comprising a gate electrode and a method of forming a data wiring comprising a source electrode and a drain electrode, various combinations of these methods may be used. Therefore, although no description is given of each of the various combinations, it should be understood that the structure of a wire to be formed by the combinations of the fourth exemplary embodiment falls within the scope of the present invention.

Next, a method of forming a thin film transistor for a display device by using the wire forming methods of the first and second exemplary embodiments of the present invention will be described.

FIGS. 7A to 7E are cross-sectional views showing a process of manufacturing a thin film transistor by employing the wire forming methods of the first and second exemplary embodiments of the present invention in the forming of a gate wiring comprising a gate electrode.

Figure 7A:
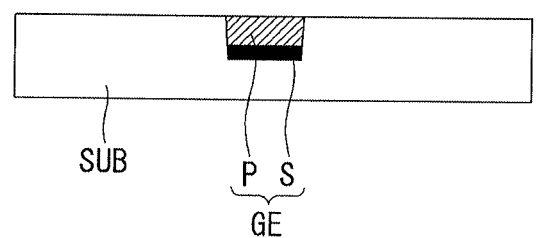
FIGS. 7A to 7E are cross-sectional views showing a process of manufacturing a thin film transistor by employing the process of forming a wire of a flat panel display according to the first or second exemplary embodiment of the present invention.

Referring to FIG. 7A, a gate electrode GE consisting of a seed metal S and a plating metal P is formed on a substrate SUB by the wire forming method of the first or second exemplary embodiment. The substrate SSB is formed of a glass material, such as boro-phosphor silicate glass (BPSG), undoped silicate glass (USG), and phosphor silicate glass (PSG), or a plastic material.

Figure 7B:
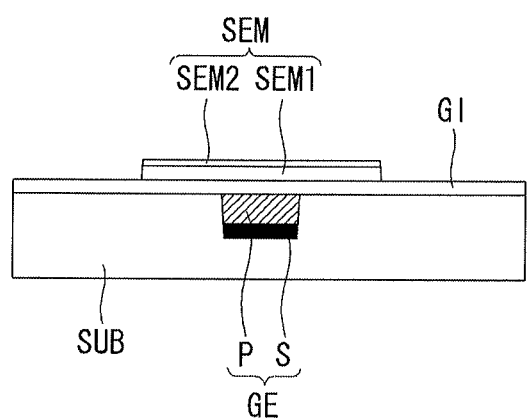

Referring to FIG. 7B, a gate insulating film GI, an amorphous silicon film SEM1, and an impurity-containing amorphous silicon film SEM2 are sequentially deposited over the entire surface of the substrate SUB with the gate electrode GE formed thereon so as to cover the gate electrode GE. The amorphous silicon film SEM1 and the impurity-containing amorphous silicon film SEM2 are patterned to form a semiconductor layer SEM.

Figure 7C:
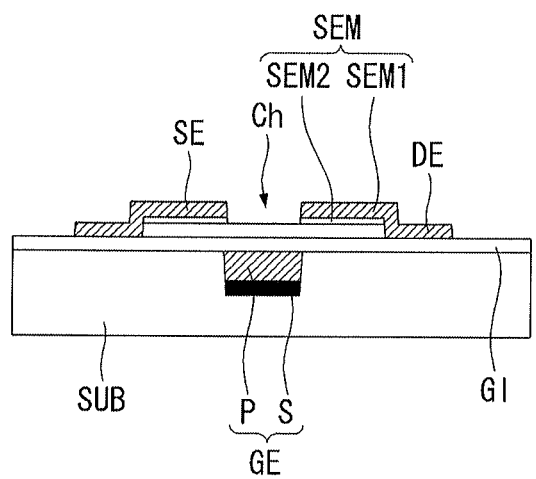

Referring to FIG. 7C, a data conductive layer is deposited over the entire surface of the substrate SUB with the semiconductor layer SEM formed thereon. The data conductive layer is patterned to form a data wiring (not shown) crossing the gate wiring, with the gate insulating film GI interposed therebetween, and a source electrode SE and a drain electrode DE on the semiconductor layer SEM so as to partially overlap with the gate electrode GE and face each other. Next, an impurity-containing amorphous silicon pattern exposed between the source electrode SE and the drain electrode DE is etched using the source electrode SE and the drain electrode DE as a mask, thereby forming a channel Ch.

Figure 7D:
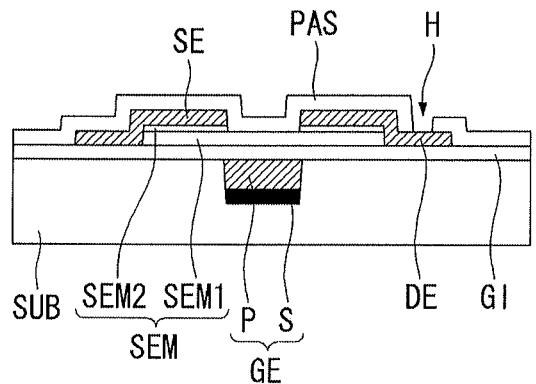

Referring to FIG. 7D, a passivation film PAS is formed over the entire surface of the substrate SUB with the data wiring (not shown), the source electrode SE, and the drain electrode DE formed thereon, and then a contact hole H is formed to expose a portion of the drain electrode DE of the thin film transistor. The passivation film PAS is for protecting the channel Ch from external moisture or contact.

Figure 7E:
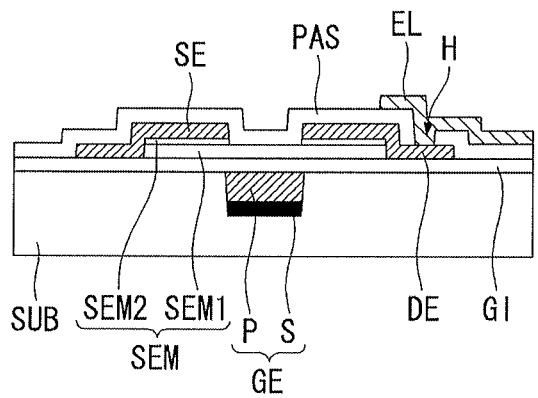

Referring to FIG. 7E, a transparent conductive layer is deposited on the passivation film PAS with the contact hole H formed therein, and then patterned to form an electrode EL. The electrode EL is connected to the drain electrode DE of the thin film transistor exposed through the contact hole H of the passivation film PAS.

FIGS. 8A to 8F are cross-sectional views showing a process of manufacturing a thin film transistor by employing the wire forming method of the first or second exemplary embodiment of the present invention in the forming of a gate electrode and the wire forming method of the third or fourth exemplary embodiment in the forming of a source electrode and a drain electrode. The process steps of FIGS. 8A and 8B in the process of FIGS. 8A to 8E are identical to those of FIGS. 7A and 7B, so a description thereof will be omitted.

Figure 8A:
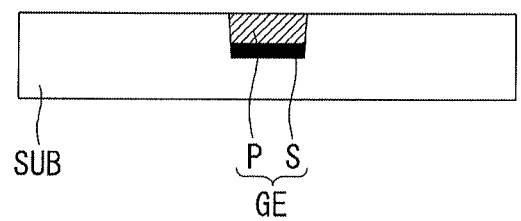
FIGS. 8A to 8F are cross-sectional views showing a process of manufacturing a thin film transistor by employing the process of forming a wire of a flat panel display according to the third or fourth exemplary embodiment of the present invention.
Figure 8B:
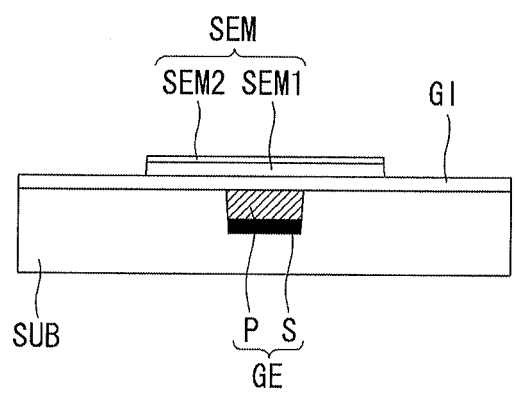
Figure 8C:
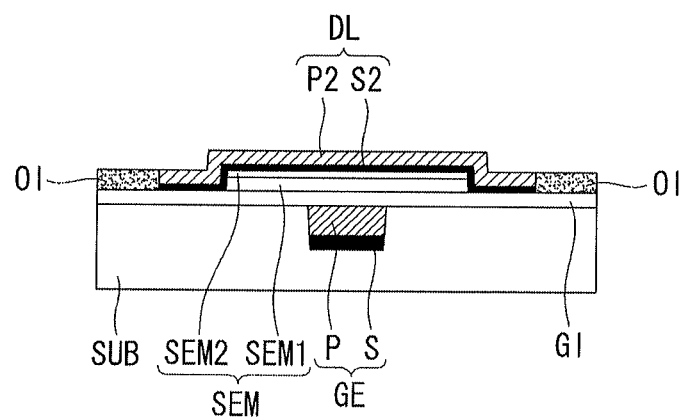

Referring to FIG. 8C, the process shown in FIGS. 5B to 5F of the third exemplary embodiment or the process shown in FIGS. 6B to 6i of the fourth exemplary embodiment is used to form an organic insulating film OI on a gate insulating film GI over the entire surface of a substrate SUB with a semiconductor layer SEM formed thereon, form grooves or through holes in the organic insulating film OI, and form a data metal layer DL consisting of a second seed metal S2 and a second plating metal PS in the grooves or through holes.

Figure 8D:
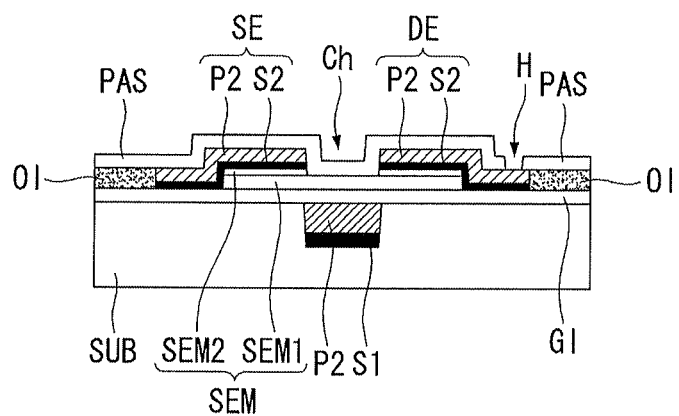

Referring to FIG. 8D, the data metal layer DL is patterned by a photolithography process to form a data wiring (not shown) crossing a gate wiring, with the gate insulating film GI interposed therebetween, and a source electrode SE and a drain electrode DE on the semiconductor layer SEM so as to partially overlap with the gate electrode GE and face each other. Next, an impurity-containing amorphous silicon film SEM2 exposed between the source electrode SE and the drain electrode DE is etched using the source electrode SE and the drain electrode DE as a mask, thereby forming a channel Ch.

Figure 8E:
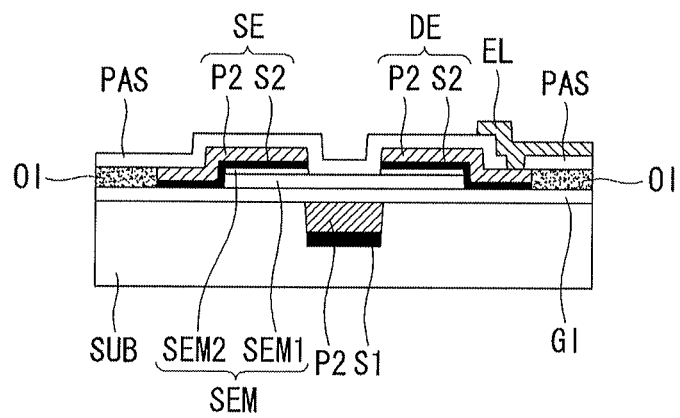

Referring to FIG. 8E, a passivation film PAS is formed over the entire surface of the substrate SUB with the data wiring (not shown), the source electrode SE, and the drain electrode DE formed thereon, and then a contact hole H is formed to expose a portion of the drain electrode DE of the thin film transistor. The passivation film PAS is for protecting the channel Ch from external moisture or contact.

Figure 8F:
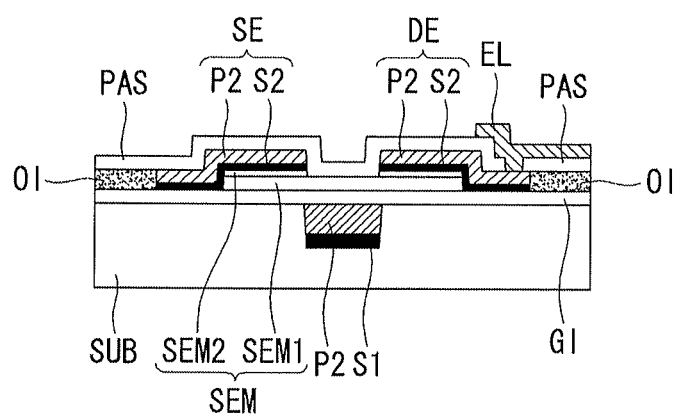

Referring to FIG. 8F, a transparent metal layer is deposited on the passivation film PAS with the contact hole H formed therein, and then patterned to form an electrode EL. The electrode EL is connected to the drain electrode DE of the thin film transistor exposed through the contact hole H of the passivation film PAS.

FIGS. 9A to 9F are cross-sectional views showing a process of manufacturing a thin film transistor by employing the wire forming method of the related art in the forming of a gate electrode and the wire forming method of the third and fourth exemplary embodiments in the forming of a source electrode and a drain electrode.

Figure 9A:
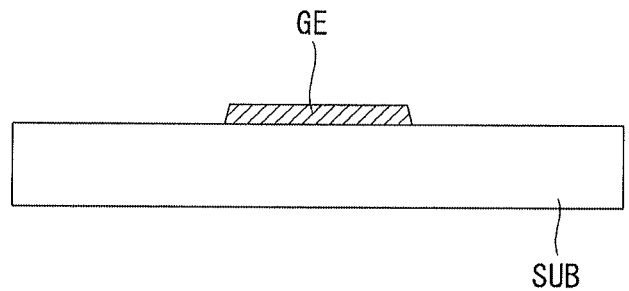
FIGS. 9A to 9F are cross-sectional views showing a process of manufacturing a thin film transistor by employing the process of forming a wire of a flat panel display according to the third or fourth exemplary embodiment of the present invention.

Referring to FIG. 9A, a gate metal film is deposited on a substrate SUB and patterned to form a gate wiring (not shown) and a gate electrode GE extending from the gate wiring.

Figure 9B:
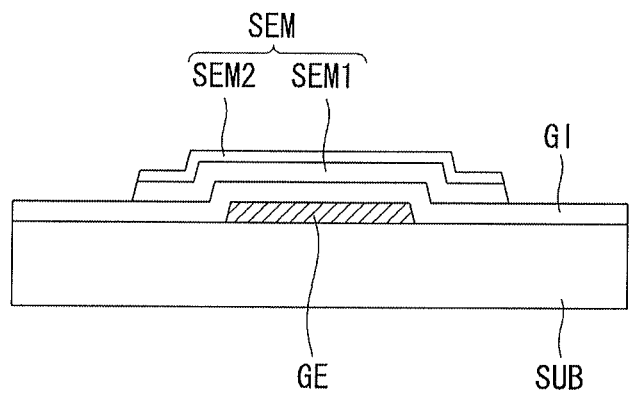

Referring to FIG. 9B, a gate insulating film GI, an amorphous silicon film SEM1, and an impurity-containing amorphous silicon film SEM2 are sequentially deposited over the entire surface of the substrate SUB with the gate electrode GE formed thereon so as to cover the gate electrode GE. The amorphous silicon film SEM1 and the impurity-containing amorphous silicon film SEM2 are patterned to form a semiconductor layer SEM.

Figure 9C:
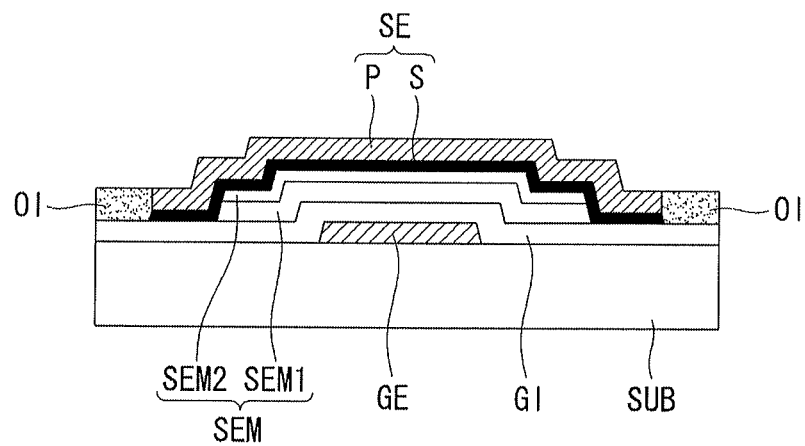

Referring to FIG. 9C, the process shown in FIGS. 5b to 5f of the third exemplary embodiment or the process shown in FIGS. 6b to 6i of the fourth exemplary embodiment is used to form an organic insulating film OI on a gate insulating film GI over the entire surface of a substrate SUB with a semiconductor layer SEM formed thereon, form grooves or through holes in the organic insulating film OI, and form a data metal layer DL consisting of a second seed metal S2 and a second plating metal PS in the grooves or through holes. The baser layer of the third and fourth exemplary embodiments consists of a gate insulating film and a semiconductor layer.

Figure 9D:
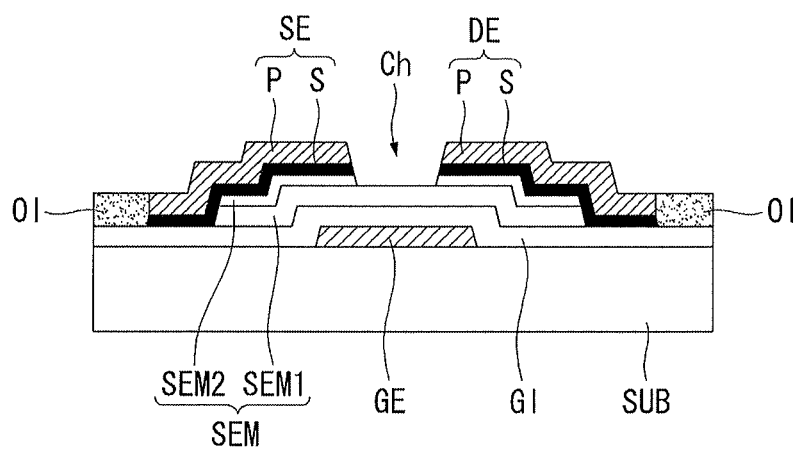

Referring to FIG. 9D, the data metal layer DL is patterned by a photolithography process to form a data wiring (not shown) crossing a gate wiring, with the gate insulating film GI interposed therebetween, and a source electrode SE and a drain electrode DE on the semiconductor layer SEM so as to partially overlap with the gate electrode GE and face each other. Next, an impurity-containing amorphous silicon film SEM2 exposed between the source electrode SE and the drain electrode DE is etched using the source electrode SE and the drain electrode DE as a mask, thereby forming a channel Ch.

Figure 9E:
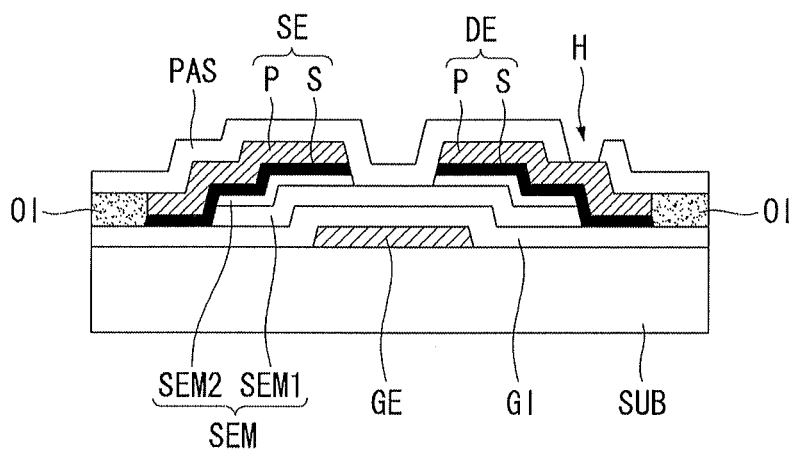

Referring to FIG. 9E, a passivation film PAS is formed over the entire surface of the substrate SUB with the data wiring (not shown), the source electrode SE, and the drain electrode DE formed thereon, and then a contact hole H is formed to expose a portion of the drain electrode DE of the thin film transistor. The passivation film PAS is for protecting the channel Ch from external moisture or contact.

Figure 9F:
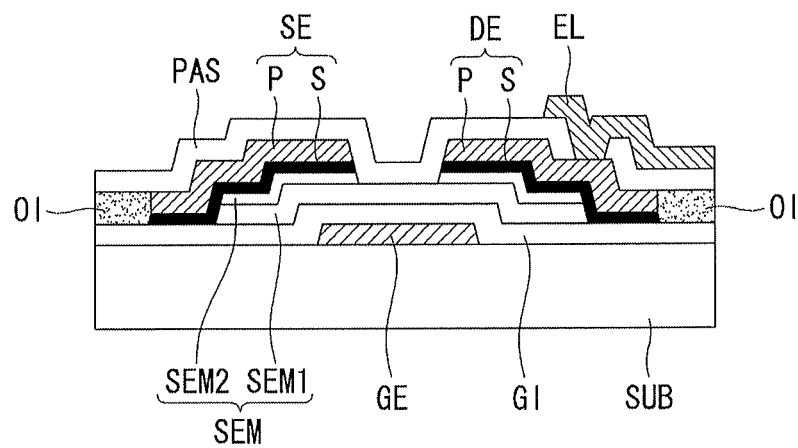

Referring to FIG. 9F, a transparent metal layer is deposited on the passivation film PAS with the contact hole H formed therein, and then patterned to form an electrode EL. The electrode EL is connected to the drain electrode DE of the thin film transistor exposed through the contact hole H of the passivation film PAS.

According to the above-described method of forming a wire and above-described method of manufacturing a thin film transistor using the same according the exemplary embodiments of the present invention, grooves or openings are formed in a base layer to form a wire using a low-resistance metal. This may increase the thickness of the wire and hence increase aperture ratio, and this may overcome the problem of step coverage caused by the increased wire thickness. Therefore, the problems of short-circuiting and flickering can be prevented, thereby leading to picture quality improvement.

Throughout the description, it should be understood for those skilled in the art that various changes and modifications are possible without departing from the technical principles of the present invention. Therefore, the technical scope of the present invention is not limited to those detailed descriptions in this document but should be defined by the scope of the appended claims.

What is claimed is:

1. A method of forming a wire, the method comprising:
sequentially, applying an organic insulating film over the a base layer and a first metal layer over the organic insulating film;
forming a first photoresist pattern on the first metal layer, using a photolithography process to expose a pattern of the first metal layer;
exposing a portion of the organic insulating film by removing a portion of the exposed pattern of the first metal layer using a wet etching process;
forming grooves in the exposed portion of the organic insulating film using a dry etching process with the metal layer functioning as a masks-after removal of remaining first photoresist pattern;
etching to remove remaining first metal layer to expose the organic insulating film with the formed grooves;
forming a second photoresist pattern on the organic insulating film, using a photolithography process to expose the formed grooves in the organic insulating film;
forming a seed layer in the formed grooves of the organic insulating film by applying a second metal layer over the formed grooves and over the second photoresist pattern, and selectively removing the second metal layer and removing the second photoresist pattern to expose the organic insulating film having the seed layer formed within the formed grooves; and
forming a wire in the formed grooves by plating a plating material over the seed layer within the formed grooves using one of: an electroless plating method or electroplating method, wherein the formed wire consists of the seed layer and the plating material.

2. The method of any one of claim 1, wherein the wire is a gate wiring including a gate electrode or a data wiring including a source electrode and a drain electrode.

3. The method of claim 2, wherein the base layer is formed of a glass material selected from the group consisting of boro-phosphor silicate glass (BPSG), undoped silicate glass (USG), and phosphor silicate glass (PSG), or a plastic material when forming the gate wiring, or formed of an inorganic insulating film selected from a silicon oxide film and a silicon nitride when forming the data wiring.

4. The method of claim 1, wherein the first and second metal layers are formed of a material selected from the group consisting of Ti, a Ti-alloy, Al, and an Al-alloy.

5. The method of claim 1, wherein the seed layer is formed of a material selected from the group consisting of Pd, Pt, Au, Cu, Mo, Cr, and Ti, and the plated layer is formed of a material selected from the group consisting of Ag, Au, and Cu.

6. A method of manufacturing a thin film transistor, the method comprising:
depositing a first metal layer on a substrate;
forming a first photoresist pattern on the first metal layer by a photolithography process to expose a portion of the substrate by etching a portion of the first metal layer according to the formed first photoresist pattern;
forming first grooves in the substrate by etching the portion of the substrate exposed through the first photoresist pattern by a dry etching process;
forming a first seed layer in the grooves of the substrate;
forming a wire consisting of a first seed layer and a first plated layer as a gate electrode by plating a first plating material on the first seed layer formed in the first grooves of the substrate layer by one of an electroless plating method or electroplating method;
sequentially depositing a gate insulating film, an amorphous silicon film, and an impurity-containing amorphous silicon film so as to cover the gate electrode, and patterning the amorphous silicon film and the impurity-containing amorphous silicon film to form a semiconductor layer;
sequentially and respectively, applying an organic insulating film and then a second metal layer over the organic insulating film on the gate insulating film over the entire surface of the substrate with the semiconductor layer formed thereon,
forming a second photoresist pattern on the second metal layer, using a photolithography process to expose a pattern of the second metal layer;
exposing a portion of the organic insulating film by removing a portion of the exposed pattern of the second metal layer using a wet etching process;
forming second grooves in the exposed portion of the organic insulating film using a dry etching process on the exposed portion of the organic insulating film , with the second metal layer functioning as a masks after removal of remaining second photoresist pattern;
etching to remove remaining second metal layer to expose the organic insulating film with the formed second grooves;
forming a third photoresist pattern on the organic insulating film, using a photolithography process to expose the formed second grooves in the organic insulating film;
forming a second seed layer in the formed second grooves of the organic insulating film by applying a third metal layer over the formed second grooves and over the third photoresist pattern, and selectively removing the third metal layer and the third photoresist pattern to expose the organic insulating film having the second seed layer formed within the formed second grooves;
forming a data conductive layer in the formed second grooves by plating a second plating material over the second seed layer within the formed second grooves using one of: an electroless plating method or electroplating method, wherein the formed data conductive layer consists of the second seed layer and the second plating material;
patterning the data conductive layer to form a source electrode and a drain electrode on the semiconductor layer so as to face each other; and
forming a channel by removing the impurity-containing amorphous silicon film exposed between the source electrode and the drain electrode by using the source electrode and the drain electrode as a mask.

* * * * *